United States Patent [19]
Schroeder

[11] Patent Number: 5,512,710
[45] Date of Patent: Apr. 30, 1996

[54] MULTILAYER PACKAGE WITH SECOND LAYER VIA TEST CONNECTIONS

[75] Inventor: Donald R. Schroeder, Elkhart, Ind.

[73] Assignee: CTS Corporation, Elkhart, Ind.

[21] Appl. No.: 934,068

[22] Filed: Aug. 21, 1992

[51] Int. Cl.[6] .................................................. H01L 23/02
[52] U.S. Cl. ............................... 174/52.4; 257/774
[58] Field of Search .............................. 174/52.1, 52.3, 174/52.4; 257/700, 701, 704, 774, 750

[56] References Cited

U.S. PATENT DOCUMENTS

| | | | |
|---|---|---|---|
| 4,221,047 | 9/1980 | Naruen et al. | 29/840 |
| 4,617,730 | 10/1986 | Geldermans et al. | 29/843 |
| 4,727,410 | 2/1988 | Higgins | 174/52.4 |
| 4,855,807 | 8/1989 | Yamaji et al. | 174/52.4 X |
| 4,866,507 | 9/1989 | Jacobs et al. | 357/74 |
| 5,041,695 | 8/1991 | Olenick | 174/52.4 |
| 5,065,228 | 11/1991 | Foster et al. | 357/80 |
| 5,239,191 | 8/1993 | Sakumoto et al. | 257/203 |
| 5,241,133 | 8/1993 | Mullen, III et al. | 174/52.4 |
| 5,243,220 | 9/1993 | Shibata et al. | 257/748 |
| 5,269,880 | 12/1993 | Jolly et al. | 156/643 |
| 5,303,119 | 4/1994 | Hilbrink | 361/749 |
| 5,317,193 | 5/1994 | Watanabe | 257/774 |
| 5,351,001 | 9/1994 | Kornrumpf et al. | 257/48 X |

*Primary Examiner*—Kristine L. Kincaid
*Assistant Examiner*—Christopher Horgan
*Attorney, Agent, or Firm*—Albert W. Watkins

[57] ABSTRACT

A package is disclosed that incorporates recessed test vias into a circuit substrate. The test vias are preferably formed at the time of substrate manufacture with little additional cost and offer access to electrical test points after hermetic sealing of the package without competing for lead sites on an otherwise crowded package exterior. The vias are preferably recessed below the surface of the substrate and may be backfilled with insulation to prevent unintended contact. Alternatively, the vias may be incorporated into the side of a package used for mounting to a motherboard, in which case the vias will be sealed at the time of package mounting. In still another instances, the vias may be left accessible or filled with a material that is easily removed for later test and service.

3 Claims, 2 Drawing Sheets

MULTILAYER PACKAGE WITH SECOND LAYER VIA TEST CONNECTIONS

BACKGROUND OF THE INVENTION

1. Field of the Invention

The invention pertains to hermetic electrical device packaging generally and specifically to packages of high density commonly encountered in multichip modules. The invention provides protected test sites as an integral part of the package to allow for greatly enhanced package densities.

2. Description of the Related Art

The prior art is best illustrated by Olenick et al in U.S. Pat. No. 5,041,695, incorporated herein by reference. Therein they illustrate a multilayer hermetic package for electronic components having a multilayer substrate. A top surface of the multilayer substrate is used to mount electronic devices. A sealing cover seals to the top of the substrate and seals the components therein. Conductive pads at the outer edges of the substrate are provided outside the sealed area. Conductive vias interconnect the external pads with the internal components.

In packages of the Olenick et al design, the top surface of the substrate becomes very crowded. The semiconductor dice mounted thereon require surface area. In addition, the sealing cover and external pads use some of the surface. Surface wiring usually consumers additional space. All of the space consumed on the surface forces the package designer to enlarge the package and thereby decrease the package density. With an enlarged package comes the associated increased expense.

Alternatively, the package designer may increase the lead density at the surface by decreasing the space between the bond pads. However, there are practical limits to how closely the bond pads may be located. The closer the bond pad spacing the more difficult attachment operations between bond pads and the leadframe become, often also increasing the cost.

There are a variety of proposals for packages which overcome the basic surface area limitation of the package illustrated by Olenick et al. Typically these proposals suggest embedding the active components within a multilayer package. Exemplary is U.S. Pat. No. 4,727,410 by Higgins. Higgins discloses a multilayer multichip module that uses chip carriers. Each chip carrier may be equipped with both circuit lines and test vias. The chip carriers are three dimensional structures that, after assembly, are mounted to a cube. Each cube may carry four or more chip carriers.

The Higgins invention is deficient in that the disclosed chip carriers are not readily manufactured. Further, the final structure is complex and rework is a significant issue. The Higgins vias also extend to the surface, and, where formed to be accessible after package assembly, would necessarily be exposed. These exposed vias present a hazard due to the possibility of contact between the vias and neighboring components. Even in non-contact, if there is a conductive body mounted immediately adjacent these vias, the possibility exists for electromagnetic coupling therebetween. In practice, the Higgins package must be further encapsulated to isolate the circuitry from surroundings.

As is known, testing prior to final assembly does not identify all defects. The embedding of the semiconductor dice as Higgins does makes any rework required after final assembly difficult or impossible. Yields necessarily suffer and costs increase.

There still exists a need for test points external to the sealed package. External test points provide for adequate testing of the dice and circuitry. Rework is then done without destruction of the dice or package. This would most desirably be achieved using standard package designs and affordable, reliable production methods.

SUMMARY OF THE INVENTION

The present invention overcomes the limitations of the prior art by incorporating test vias into a multilayer package. The vias do not extend entirely to the exterior of the multilayer substrate. Instead, the vias are recessed to a predictable, controlled depth through the use of the multilayer tape. Surface bond pads are formed on one surface of the substrate, while the test vias are accessible through the opposing surface. The vias may be left exposed but recessed, or, alternatively, may be backfilled for further isolation. The resulting package is reliable, has low rework costs, is of standard design and production, and allows for the easy protection of the test points after circuit verification. Additionally, due to the recessed nature of the test points, there is little chance for unintended electrical short circuiting even if there is no further protection of the test points. The test points are inherently electrically isolated. Any backfill insulation is additionally protected by the recess.

DESCRIPTION OF THE PREFERRED EMBODIMENT

Figure 1:
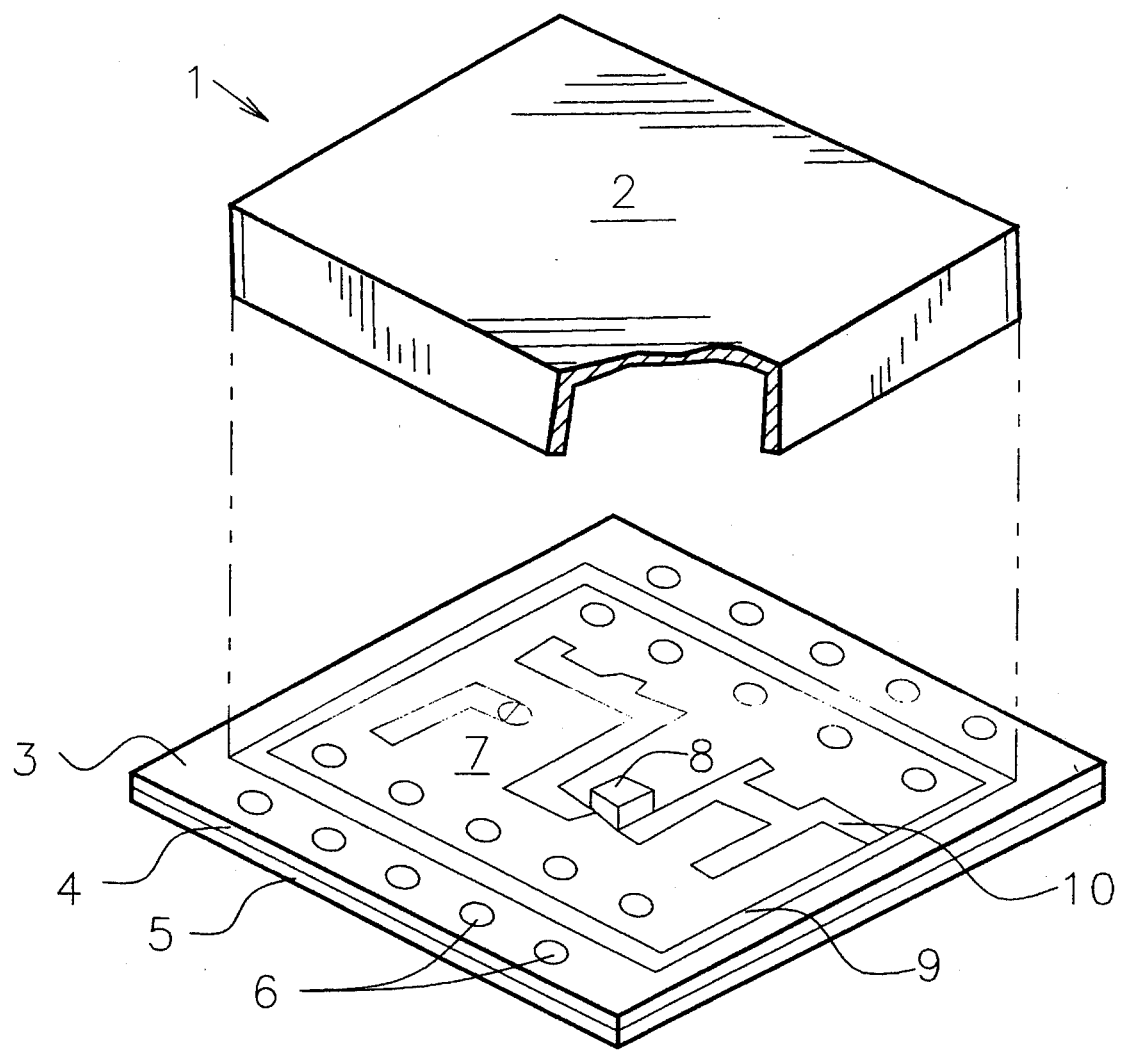
FIG. 1 illustrates a top perspective view of the preferred embodiment of the present invention.

The package 1 of the invention is illustrated generally in FIG. 1. Package 1 includes cover 2 and substrate 3 of multiple layers 4 and 5. Within a hermetic cavity 7 formed between cover 2 and substrate 3 are bond pads 6, semiconductor die 8 and electrical conductors 10.

In practice, individual layers 4 and 5 are metallized and then integrated into substrate 3. While only two layers 4 and 5 are illustrated in FIG. 1 it is understood that any number of layers suited for the particular application may be used. Once the substrate 3 is metallized and appropriately integrated, the substrate is typically tested to verify functionality.

The semiconductor die 8 and any other components (not illustrated) are mounted to substrate 3 and electrically attached thereto. Typically there may be epoxy, solder and wire bond operations required, with mounting of additional passive components such as capacitors and resistors. A single semiconductor die 8 is illustrated, but there are often applications for multiple dice. A hermetic seal between cover 2 and seal ring 9 to substrate 3 is the final enclosing step in the assembly of the package. Generally, the circuitry is tested just prior to the final sealing operation to uncover any defective parts. After final seal, rework is very difficult, so it is important to eliminate as many failures prior to sealing as possible.

Once the package is sealed, there may be a thermal aging step to eliminate components with hard to detect microdefects. If a defect is found, cover 2 may be removed and the defective component replaced. Cover 2 is then resealed to ring 9.

While many materials and methods are suitable for the practice of this invention, in the preferred embodiment cover 2 is a Kovar composition comprising iron, nickel and cobalt. The invention is not limited so. A variety of metals, ceramics, and composites are considered for the purposes of the invention. Kovar is selected for cover 2 in combination with a glass and ceramic multilayer tape for substrate 3 as these materials have matched thermal characteristics and provide excellent hermeticity. Thermal extremes are also withstood by a package of this construction. This is particularly true where the thermal coefficient of expansion of the materials of the substrate and the cover are more nearly matched to that of the silicon die 8 and any other components. Other advantages of this construction will become apparent below.

The sealing ring 9 is preferably a metallized area upon substrate 3 to which cover 2 may be brazed, soldered, attached with sealing glass, epoxy or other means. Ring 9 may be formed simultaneously with the formation of conductors 10 and bond pads 6 or, alternatively, may be formed as a separate operation. While not illustrated, it is understood that upon assembly of package 1, there may be leads, leadframes, wirebonds or other electrical interconnection attached to bond pads 6 for electrical communication between package 1 and a separate circuit.

Figure 2:
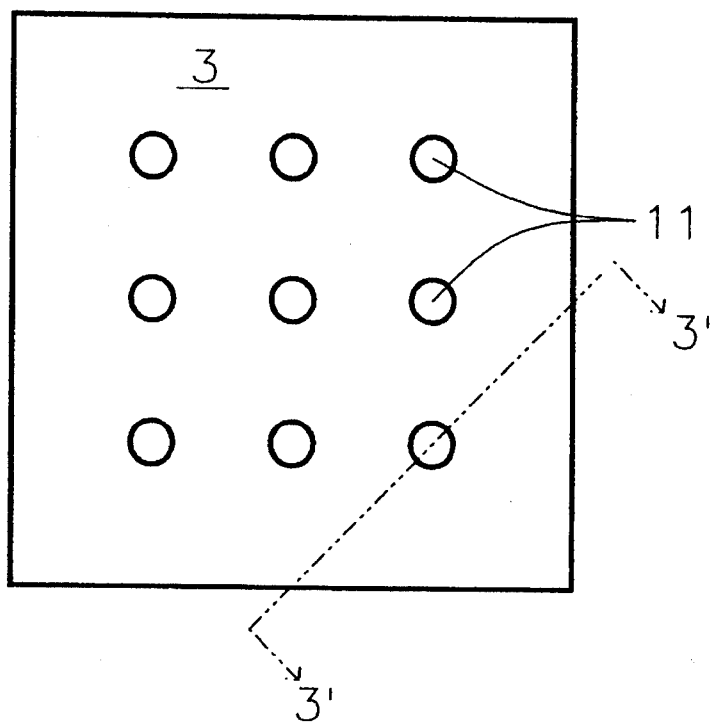
FIG. 2 illustrates the preferred embodiment of the present invention from a bottom view.

FIG. 2 shows package 1 from a bottom view, wherein only substrate 3 and test vias 11 are visible. These test vias 11 serve as complimentary electrical connectors to the surface bond pads 6, while not consuming any of the area of the top surface of substrate 3. Where the package 1 is mounted bottom side down upon a mother board (not illustrated), these test vias are concealed and inherently protected from external contact. However, before mounting, the vias are available for probing to determine the electrical condition of the circuitry within package 1. Noteworthy also here is the understanding that "top" and "bottom" of the substrate are only relative terms herein and that the package layout is fully invertible. Typical electronic components are not preferential to a particular gravitational orientation to the substrate. Further, one of ordinary skill will realize that the test vias may be arranged on the side of the substrate common to the semiconductor, while the bond pads may be arranged opposite thereof. Any other combination therebetween is within the teachings of this invention.

Figure 3:
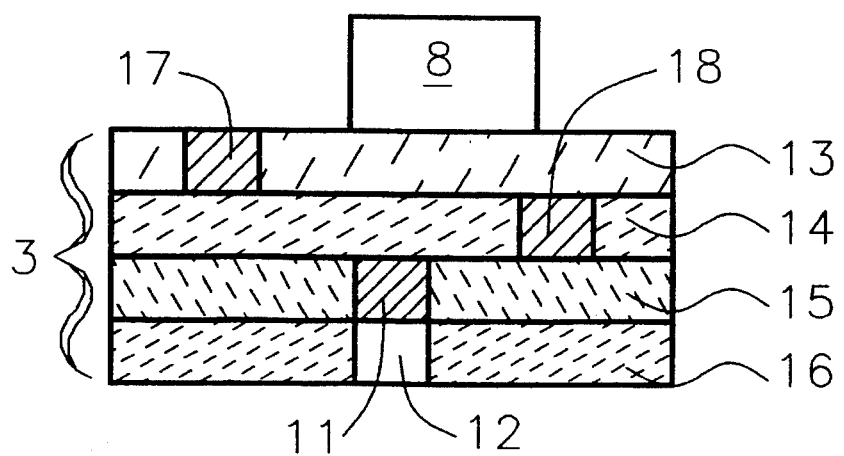
FIG. 3 illustrates the preferred embodiment of the present invention from a partial cross-section view taken along line 3'.

FIG. 3 shows package 1 by cross-section view along line 3' of FIG. 2. In this illustration, substrate 3 is shown with four layers 13–16 as opposed to the two layers 4 and 5 of FIG. 1. Again, the number of substrate layers is certainly within the level of ordinary skill, provided there are sufficient layers to practice the teachings of the present invention.

Via 11 is formed in ceramic tape layer 15 and may serve to connect a conductor similar to conductors 10 through via 11 to a test probe (not illustrated). Hole 12 in layer 16 provides the physical separation of via 11 from the bottom surface of substrate 3, while also allowing access to appropriately dimensioned test probes. Hole 12 may be backfilled with a protective material after all required testing, or may be left open as is desired. Vias 17 and 18 are also illustrated for exemplary purposes, as one known advantage of a multilayer circuit substrate is the ability to form conductive vias to interconnect between the various layers. Semiconductor die 8 is also illustrated in FIG. 3, though the exact placement or nature of the electrical components to be housed within this package 1 does not form a critical part of the invention.

In the preferred embodiment, a glass and ceramic tape is used for the production of substrate 3. This tape may be a material such as Green Tape available from Du Pont. In practice, the tape is received as a flexible film. Circuitry is patterned upon the surfaces of the tape, while vias may be punched, drilled or otherwise removed from the tape. After the via holes are formed, metallization is applied, typically through screen printing or stencil, to the via holes. Since the tape is delivered in precisely controlled thicknesses, the depth of each via 11 and recess 12 may also be precisely controlled in integral multiples of the tape thickness.

After patterning the tape, the tape is then laminated and fired at elevated temperatures. The resulting structure is very compact and rigid. The fired tape possesses good mechanical strength and also resistance to elevated temperatures and other environmental factors.

By combining the use of the tape with recessed vias, the preferred embodiment addresses many of the aforementioned problems of the prior art. Since the package may withstand temperature much better than most packages, rework is more readily achieved. This is nearly essential where packages become very complex and house many semiconductors. The package offers exceptional control over the recess depth, allowing component test equipment to be fixtured to a predictable physical requirement without the need for ways to adapt for large manufacturing tolerances otherwise encountered in recessing. While the foregoing details what is felt to be the preferred embodiment of the invention, no material limitations to the scope of the claimed invention are intended. Glass and ceramic tapes are elucidated in the preferred embodiment and offer many unique advantages. However, the teachings presented herein are not limited strictly thereto. Glass - epoxy circuit boards are typically formed as multilayer laminates and would potentially offer many of the same advantages (though not all) as the tape of the preferred embodiment. Further, features and design alternatives that would be obvious to one of ordinary skill in the art are considered to be incorporated herein. The scope of the invention is set forth and particularly described in the claims hereinbelow.

I claim:

1. A multilayer package for an electronic device comprising:

an enclosing means for enclosing said electronic device and environmentally isolating said electronic device from an environment external to said enclosing means;

an electrically conductive test point means for electrically interconnecting said electronic device to said external environment;

an electrically non-conductive isolating means for isolating said test point means, said isolating means exterior to said test point means, said isolating means having an opening extending entirely therethrough to expose said test point means to said external environment, said isolating means and said opening therethrough cooperatively allowing electrical access to said test point by an electrical conductor probe means;

an electrically non-conductive filling means for filling said opening, said filling means preventing access by said probe means after filling thereof.

2. A multilayer hermetic package for an electronic device comprising:

a multilayer glass substrate having electrical conductors patterned thereon and therein and having an exterior layer;

a covering means hermetically sealing a chamber between said covering means and said substrate, said chamber surrounding said electronic device:

an electrically conductive via formed in a first layer of said multilayer substrate immediately adjacent said exterior layer, said electrically conductive via operatively electrically interconnected to said electrical conductors for electrically probing an electrical circuit formed by said electrical conductors;

an electrically non-conductive opening in said exterior layer corresponding to said via, whereby said via may be electrically probed through said opening.

3. The multilayer hermetic package of claim 2 further comprising an electrically non-conductive filling means for filling said opening, said filling means preventing said electrical probing through said opening.

* * * * *